United States Patent
Jang et al.

(10) Patent No.: US 10,359,799 B2
(45) Date of Patent: Jul. 23, 2019

(54) BANDGAP REFERENCE VOLTAGE GENERATION CIRCUIT AND BANDGAP REFERENCE VOLTAGE GENERATION SYSTEM

(71) Applicant: SAMSUNG ELECTRONICS CO., LTD., Suwon-si, Gyeonggi-do (KR)

(72) Inventors: Woo Jin Jang, Hwaseong-si (KR); Seung Hyun Oh, Seoul (KR); Jong Woo Lee, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 15/914,095

(22) Filed: Mar. 7, 2018

(65) Prior Publication Data

US 2019/0079553 A1    Mar. 14, 2019

(30) Foreign Application Priority Data

Sep. 12, 2017 (KR) .......................... 10-2017-0116578

(51) Int. Cl.
*G05F 3/16* (2006.01)
*H03K 17/567* (2006.01)

(52) U.S. Cl.
CPC ............. *G05F 3/16* (2013.01); *H03K 17/567* (2013.01)

(58) Field of Classification Search
CPC .. G05F 1/59; G05F 1/595; G05F 3/16; H03K 17/567
See application file for complete search history.

(56) References Cited

U.S. PATENT DOCUMENTS

| | | |
|---|---|---|
| 6,150,872 A | 11/2000 | McNeill et al. |
| 6,204,724 B1 | 3/2001 | Kobatake |
| 7,199,646 B1 | 4/2007 | Zupcau et al. |
| 7,227,401 B2 | 6/2007 | Zhang et al. |
| 7,633,334 B1 | 12/2009 | Li et al. |
| 7,705,662 B2 | 4/2010 | Ng et al. |
| 7,990,130 B2 | 8/2011 | Yoshikawa |
| 8,704,588 B2 | 4/2014 | Conte et al. |
| 2014/0232453 A1* | 8/2014 | Choi .......................... G05F 3/16 327/539 |

* cited by examiner

*Primary Examiner* — Kyle J Moody
(74) *Attorney, Agent, or Firm* — Lee & Morse, P.C.

(57) ABSTRACT

A bandgap reference voltage generation system includes a common mode voltage generator, a bandgap reference voltage generation circuit, and a switch controller. The bandgap reference voltage generation circuit includes a plurality of transistors having source terminals respectively connected to drain terminals of a plurality of PMOS transistors. The switch controller provides a ground voltage to the bandgap reference voltage generation circuit in a first mode and a common mode voltage to the bandgap reference voltage generation circuit in a second mode. The bandgap reference voltage generation circuit causes the plurality of the transistors to operate in a linear region by providing the common mode voltage to gate electrodes of the plurality of the transistors in the first mode and a saturation region by providing the ground voltage to the gate electrodes of the plurality of the transistors in the second mode.

20 Claims, 8 Drawing Sheets

BANDGAP REFERENCE VOLTAGE GENERATION CIRCUIT AND BANDGAP REFERENCE VOLTAGE GENERATION SYSTEM

CROSS-REFERENCE TO RELATED APPLICATION

Korean Patent Application No. 10-2017-0116578, filed on Sep. 12, 2017, and entitled, "Bandgap Reference Voltage Generation Circuit and Bandgap Reference Voltage Generation System," is incorporated by reference herein in its entirety.

BACKGROUND

1. Field

One or more embodiments described herein relate to a bandgap reference voltage generation circuit and a bandgap reference voltage generation system.

2. Description of the Related Art

A bandgap reference voltage generation circuit may be used in a semiconductor integrated circuit to supply a stable bias voltage. For example, a bandgap reference voltage generation circuit may provide a reference voltage of an analog-digital converter or a digital-analog converter. Also, the bandgap reference voltage generation circuit may output a reference voltage of a constant level irrespective of temperature or process change.

When a supply voltage in a high supply voltage range (e.g., 1.5 to 5.0 V) is applied to a bandgap reference voltage generation circuit operating in a low supply voltage range (e.g., 1.1 to 1.5 V), a breakdown voltage may be applied to transistors in the bandgap reference voltage generation circuit. As a result, the transistors may be permanently damaged. When a supply voltage lower than 1.4 V is applied to a bandgap reference voltage generation circuit operating in a high supply voltage range (e.g., 1.5 to 5.0 V), it may be difficult for the bandgap reference voltage generation circuit to operate normally. Also, a low voltage design may be difficult to realize for a bandgap reference voltage generation circuit.

SUMMARY

In accordance with one or more embodiments, a bandgap reference voltage generation system includes a common mode voltage generator to generate a common mode voltage; a bandgap reference voltage generation circuit to generate a bandgap reference voltage, the bandgap reference voltage generation circuit including a plurality of p-channel metal oxide semiconductor (PMOS) transistors and a plurality of transistors having source terminals respectively connected to drain terminals of the PMOS transistors; and a switch controller to provide a ground voltage to the bandgap reference voltage generation circuit in a first mode and the common mode voltage to the bandgap reference voltage generation circuit in a second mode, wherein the bandgap reference voltage generation circuit is to cause the plurality of the transistors to operate in: a linear region by providing the common mode voltage to a gate electrode of each of the plurality of the transistors in the first mode and a saturation region by providing the ground voltage to the gate electrode of each of the plurality of the transistors in the second mode.

In accordance with one or more other embodiments, a bandgap reference voltage generation circuit includes an amplifier to output an operational amplified signal based on a first voltage and a second voltage; a first PMOS transistor, a second PMOS transistor, and a third PMOS transistor having gate terminals connected to an output terminal of the amplifier and having respective source terminals connected to a supply voltage terminal; a first LDMOS transistor having a source terminal connected to a drain terminal of the first PMOS transistor, a gate terminal connected to a first node, and a drain terminal connected to an output terminal of the first voltage; a second LDMOS transistor having a source terminal connected to a drain terminal of the second PMOS transistor, a gate terminal connected to the first node, and a drain terminal connected to an output terminal of the second voltage; and a third LDMOS transistor having a source terminal connected to a drain terminal of the third PMOS transistor, a gate terminal connected to the first node, and a drain terminal connected to an output terminal of a bandgap reference voltage.

In accordance with one or more other embodiments, a bandgap reference voltage generation circuit includes an amplifier to output an operational amplified signal based on a first voltage and a second voltage; a first PMOS transistor to generate a first current based on the operational amplified signal received through a first gate terminal and a supply voltage received through a first source terminal; a second PMOS transistor to generate a second current based on the operational amplified signal received through a second gate terminal and the supply voltage received through a second source terminal; a third PMOS transistor to generate a third current the operational amplified signal received through a third gate terminal and receiving the supply voltage through a third source terminal; a first transistor connected to the first PMOS transistor in a cascode manner; a second transistor connected to the second PMOS transistor in the cascode manner; and a third transistor connected to the third PMOS transistor in the cascode manner, wherein the first transistor is to provide different voltages to a first drain terminal of the first PMOS transistor in a first mode and a second mode different from the first mode, wherein the second transistor is to provide different voltages to a second drain terminal of the second PMOS transistor in the first mode and the second mode, and wherein the third transistor is to provide different voltages to a third drain terminal of the third PMOS transistor in the first mode and the second mode.

BRIEF DESCRIPTION OF THE DRAWINGS

Features will become apparent to those of skill in the art by describing in detail exemplary embodiments with reference to the attached drawings in which.

DETAILED DESCRIPTION

A bandgap reference voltage generation circuit and system for generating a bandgap reference voltage as described herein may be suitable for use in providing a power supply voltage throughout a wide range of voltages. A bandgap reference voltage generation circuit and a bandgap reference voltage generation system according to some embodiments may be used in an Internet of things (IoT) system supplied with a power supply voltage of 1.5 V, an IoT system supplied with a power supply voltage of 3.0 to 5.0 V, a power management integrated circuit (PMIC) for mobile terminals supplied with a power supply voltage of 2.7 to 4.2 V, and a low voltage system supplied with a power supply voltage of 1.1 to 5.5 V.

Figure 1:
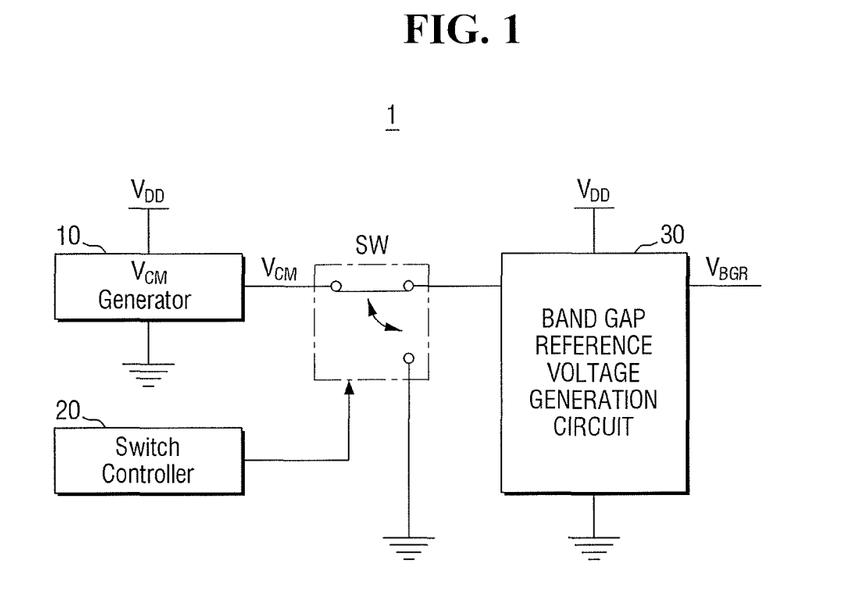
FIG. 1 illustrates an embodiment of a bandgap reference voltage generation system.

FIG. 1 illustrates an embodiment of a bandgap reference voltage generation system 1 which may include a common mode voltage generator 10, a switch controller 20, a bandgap reference voltage generation circuit 30, and a switch SW. The bandgap reference voltage generation system 1 may have more or fewer components than the above-listed components in some embodiments.

The common mode voltage generator 10 may generate a common mode voltage $V_{CM}$ based on a supply voltage $V_{DD}$. For example, the common mode voltage generator 10 may include a plurality of transistors that generate the common mode voltage $V_{CM}$ based on the supply voltage $V_{DD}$. An example of the common mode voltage $V_{CM}$ may be defined by Equation 1.

$$V_{CM}=V_{DD}/2 \qquad (1)$$

The common mode voltage $V_{CM}$ generated by the common mode voltage generator 10 may be calculated using not just Equation 1 but various other mathematical expressions.

The switch controller 20 may control the switch SW in the bandgap reference voltage generation system 1. In an example embodiment, the switch controller 20 may control the switch SW to connect a reference (e.g., ground) power source to the bandgap reference voltage generation circuit 30 in a low voltage mode used in a low voltage range of 1.1 to 1.5 V. In this case, a ground voltage may be provided to the bandgap reference voltage generation circuit 30.

In another example embodiment, the switch controller 20 may control the switch SW to connect the common mode voltage generator 10 to the bandgap reference voltage generation circuit 30 in a high voltage mode used in a high voltage range of 1.5 to 5.5V. In this case, the common mode voltage generator 10 may provide the common mode voltage $V_{CM}$, as an output voltage, to the bandgap reference voltage generation circuit 30.

According to some embodiments, when receiving a signal indicating that the low voltage mode has been selected, the switch controller 20 may control the switch SW to connect the ground power source to the bandgap reference voltage generation circuit 30. When receiving a signal indicating that the high voltage mode has been selected, the switch controller 20 may control the switch SW to connect the common mode voltage generator 10 to the bandgap reference voltage generation circuit 30.

According to some embodiments, the switch controller 20 may include a sensor that recognizes the range of the supply voltage $V_{DD}$. When the magnitude of the supply voltage $V_{DD}$ corresponds to the low voltage mode, the switch controller 20 may control the switch SW to connect the ground power source to the bandgap reference voltage generation circuit 30. When the magnitude of the supply voltage $V_{DD}$ corresponds to the high voltage mode, the switch controller 20 may control the switch SW to connect the common mode voltage generator 10 to the bandgap reference voltage generation circuit 30.

The bandgap reference voltage generation circuit 30 may generate a reference voltage that does not change, even when a process, supply voltage, and/or temperature changes. The bandgap reference voltage generation circuit 30 may include a plurality of transistors and a plurality of resistors. The transistors in the bandgap reference voltage generation circuit 30 may include, for example, a plurality of p-channel metal oxide semiconductor (PMOS) transistors, a plurality of laterally diffused metal oxide semiconductor (LDMOS) transistors, and/or a plurality of bipolar junction transistors (BJTs).

Figure 2:
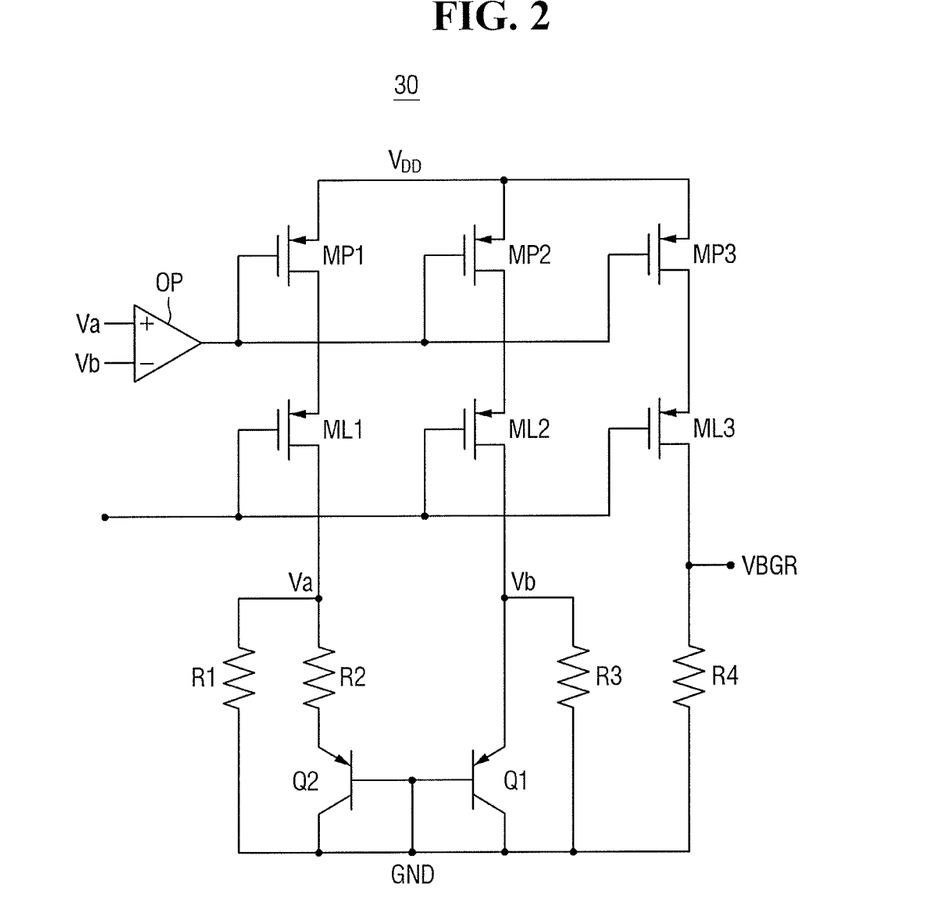
FIG. 2 illustrates an embodiment of bandgap reference voltage generation circuit.
Figure 3:
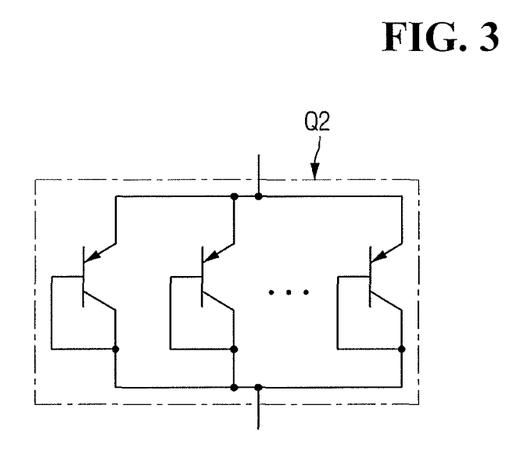
FIG. 3 illustrates an embodiment of a bipolar junction transistor (BJT) in the bandgap reference voltage generation circuit.

FIG. 2 illustrates an embodiment of the bandgap reference voltage generation circuit 30. FIG. 3 illustrates an embodiment of a BJT in the bandgap reference voltage generation circuit 30.

The bandgap reference voltage generation circuit 30 may generate a bandgap reference voltage VBGR that does not change, even when a process, supply voltage, and/or temperature changes.

The bandgap reference voltage generation circuit 30 may include a plurality of PMOS transistors MP1 MP2 and MP3, a plurality of transistors ML1 ML2, ML3, a plurality of resistors R1 R2, R3 and R4, a plurality of BJTs Q1 and Q2, and an amplifier OP. A source terminal of each of the plurality of the PMOS transistors MP1, MP2 and MP3 may be connected to a supply voltage terminal to which the supply voltage $V_{DD}$ is provided. A gate terminal of each of the plurality of the PMOS transistors MP1, MP2 and MP3 may be connected to an output terminal of the amplifier OP. Drain terminals of the plurality of the PMOS transistors MP1, MP2 and MP3 may be connected to source terminals of the plurality of the transistors ML1, ML2 and ML3, respectively. The plurality of the transistors ML1, ML2 and ML3 may respectively be connected to the plurality of the PMOS transistors MP1, MP2 and MP3, for example, in a cascode manner.

The plurality of the transistors ML1, ML2 and ML3 connected respectively to each of the plurality of the PMOS transistors MP1, MP2 and MP3 in a cascode manner may be, for example, LDMOS transistors. In other embodiments, various transistors may be connected to the plurality of the PMOS transistors MP1, MP2 and MP3 in a cascode manner.

The common mode voltage $V_{CM}$ or the ground voltage may be provided to a gate terminal of each of the plurality of the transistors ML1, ML2 and ML3 through the switch controller 20 of FIG. 1. For example, a drain terminal of the first LDMOS transistor ML1 may be coupled to an output terminal of a first voltage Va. The output terminal of the first voltage Va may be connected to a first input terminal of the amplifier OP. A drain terminal of the second LDMOS transistor ML2 may be connected to an output terminal of a second voltage Vb. The output terminal of the second voltage Vb may be connected to a second input terminal of the amplifier OP. A drain terminal of the third LDMOS transistor ML3 may be connected to a terminal that outputs the bandgap reference voltage VBGR.

The amplifier OP may output an operational amplified signal based on the first voltage Va input to the first input terminal and the second voltage Vb input to the second input terminal. The operational amplified signal output from the amplifier OP may be input to the gate terminal of each of the plurality of the PMOS transistors MP1, MP2, and MP3. When the first voltage Va and the second voltage Vb correspond to each other, the bandgap reference voltage VBGR may be output from the bandgap reference voltage generation circuit 30.

The first BJT Q1 and the third resistor R3 may be between the output terminal of the second voltage Vb and a reference (e.g., ground) voltage terminal. The third resistor R3 may be connected in parallel to the first BJT Q1.

The first resistor R1, the second resistor R2, and the second BJT Q2 may be between the output terminal of the first voltage Va and the ground voltage terminal. The first resistor R1 may be connected in parallel to the second resistor R2 and the second BJT Q2, and the second resistor R2 may be connected in series to the second BJT Q2.

The second resistor R2 may be between the second BJT Q2 and the output terminal of the first voltage Va. An emitter terminal of the second BJT Q2 may be connected in series to the second resistor R2. A base terminal and a collector terminal of the second BJT Q2 may be connected to the ground voltage terminal.

Referring to FIG. 3, a plurality of BJTs may be connected in parallel to form the second BJT Q2. The gate terminal and the collector terminal of each of the BJTs may be connected to the ground voltage terminal. The emitter terminal of each of the BJTs may be connected to the second resistor R2 (e.g., see FIG. 2).

Referring again to FIG. 2, the fourth resistor R4 may be between the drain terminal of the third transistor ML3 (e.g., an LDMOS transistor) and the ground voltage terminal. An output terminal of the bandgap reference voltage VBGR may be between the drain terminal of the third transistor ML3 (e.g., an LDMOS transistor) and the ground voltage terminal. According to some embodiments, the resistance value of the first resistor R1 may correspond to a resistance value of the third resistor R3.

Figure 4:
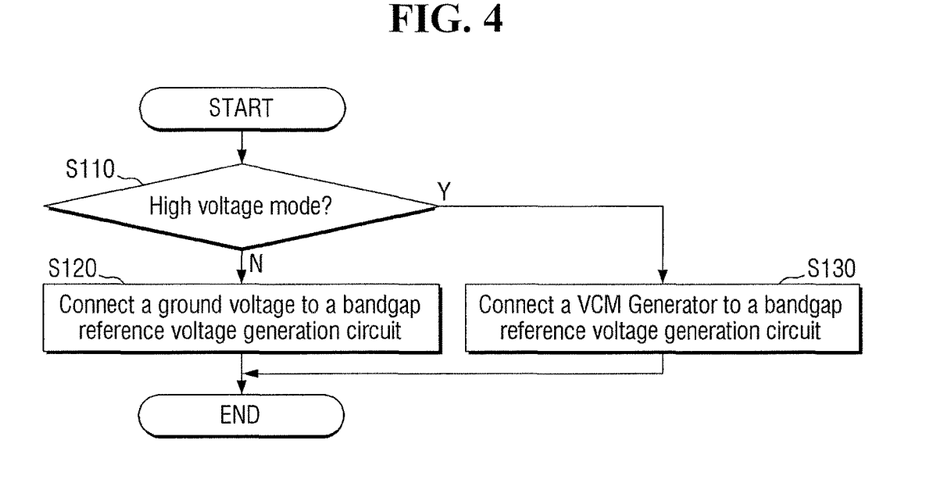
FIG. 4 illustrates an embodiment for operating a bandgap reference voltage generation system.
Figure 5:
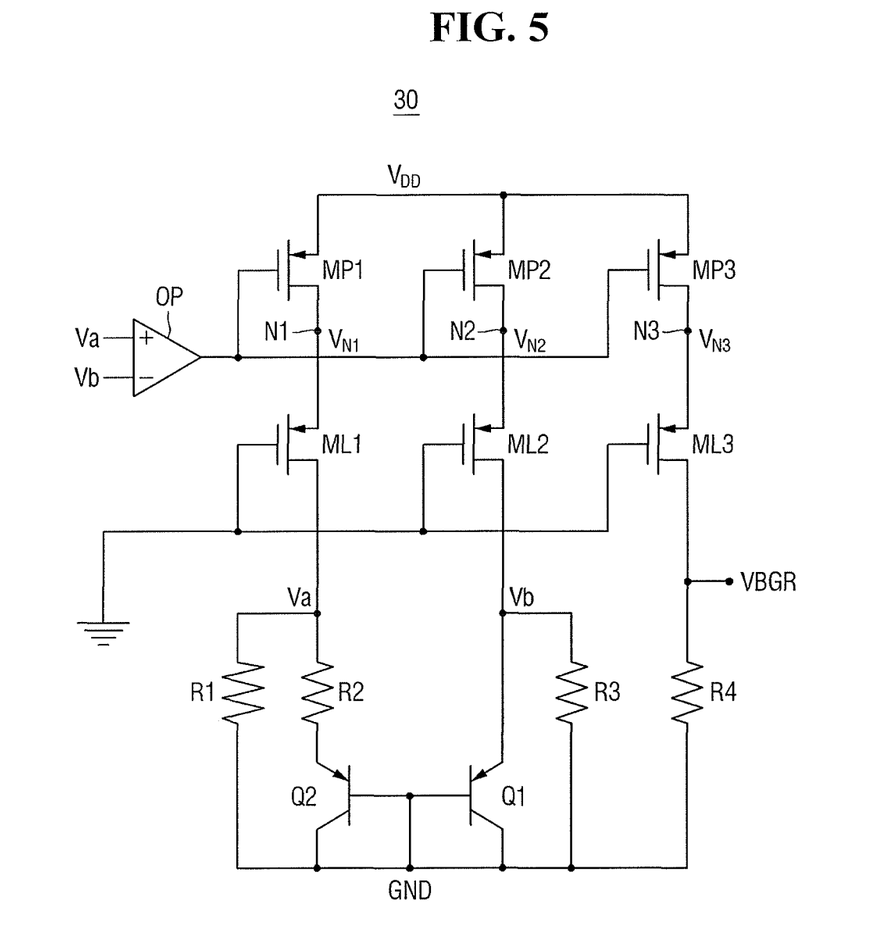
FIG. 5 illustrates an embodiment of a bandgap reference voltage generation circuit provided with a ground voltage.
Figure 6:
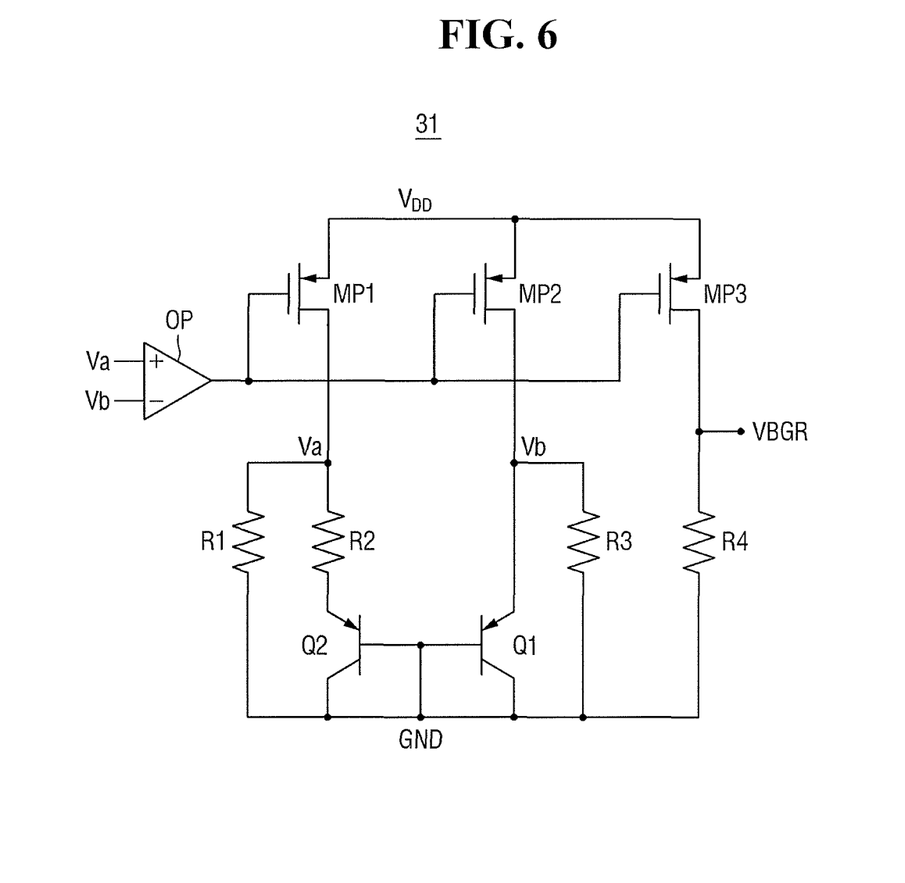
FIG. 6 illustrates another embodiment of a bandgap reference voltage generation circuit provided with a ground voltage.
Figure 7:
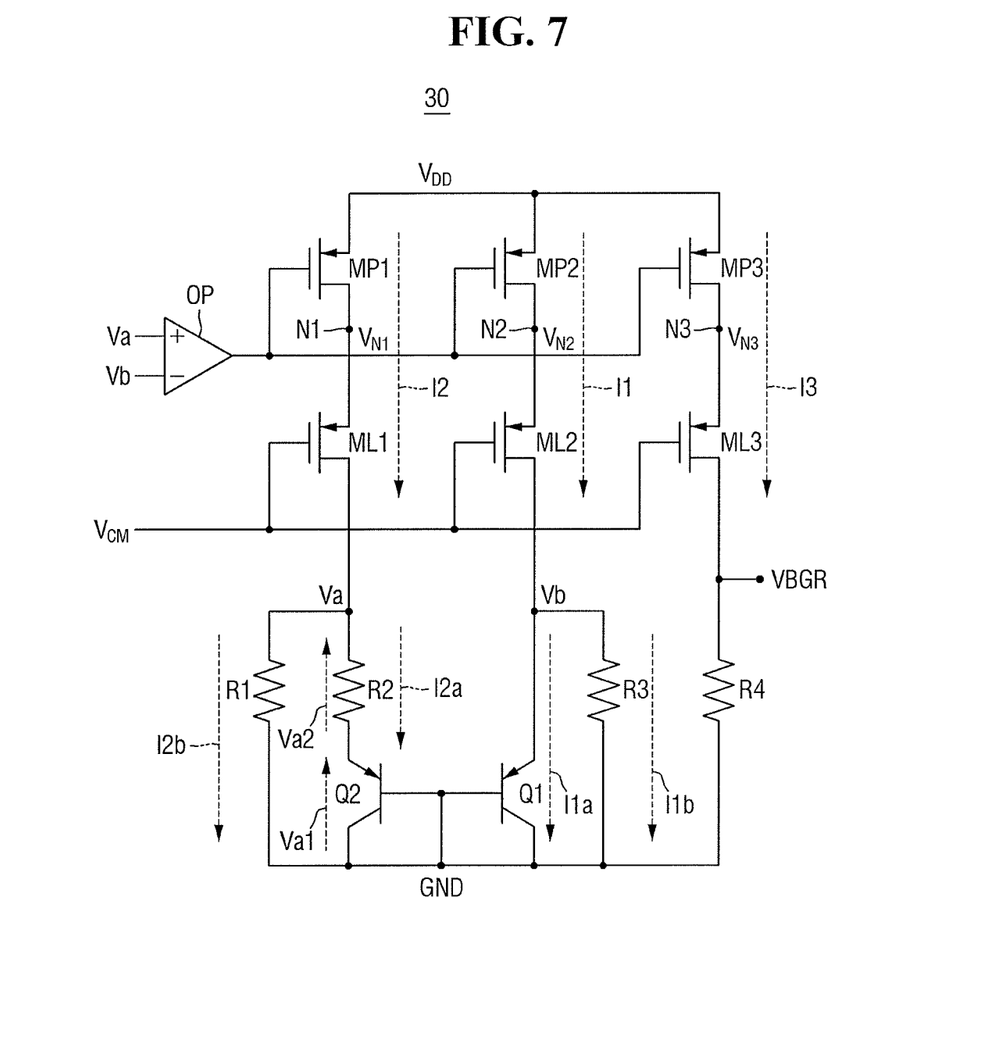
FIG. 7 illustrates an embodiment of a bandgap reference voltage generation circuit provided with a common mode voltage.

FIG. 4 illustrates an embodiment of operations of a bandgap reference voltage generation system. FIG. 5 illustrates another embodiment of a bandgap reference voltage generation circuit provided with a ground voltage. FIG. 6 illustrates another embodiment of a bandgap reference voltage generation circuit provided with a ground voltage. FIG. 7 illustrates another embodiment of a bandgap reference voltage generation circuit provided with a common mode voltage. In FIGS. 4 to 7, a plurality of transistors connected to a plurality of PMOS transistors in a cascode manner are LDMOS transistors.

A switch controller may recognize the mode of a bandgap reference voltage generation system (operation S110). The mode may refer to the range of a supply voltage provided to the bandgap reference voltage generation system. For example, the mode may be a high voltage mode when the supply voltage is in a first predetermined range (e.g., a range of 1.5 to 5.5 V) and may be a low voltage mode when the supply voltage is in a second predetermined range, e.g., the range of 1.1 to 1.5 V. These ranges may be different in other embodiments.

According to some embodiments, the bandgap reference voltage generation system may set a current mode to the high voltage mode or the low voltage mode, for example, based on a user input or another type of control signal. For example, when the current mode is set to the high voltage mode based on the user input, the switch controller may recognize the mode of the bandgap reference voltage generation system as the high voltage mode. When the current mode is set to the low voltage mode based on the user input, the switch controller may recognize the mode of the bandgap reference voltage generation system as the low voltage mode.

According to some embodiments, when the mode of the bandgap reference voltage generation system is the high voltage mode, the mode may be changed to the low voltage mode based on a user input. When the mode of the bandgap reference voltage generation system is the low voltage mode, the mode may be changed to the high voltage mode based on a user input.

When recognizing that the mode of the bandgap reference voltage generation system is the low voltage mode (N in operation S110), the switch controller may control a switch to connect a ground voltage to a bandgap reference voltage generation circuit (operation S120).

Referring to FIG. 5, when the ground voltage is connected to the bandgap reference voltage generation circuit in the low voltage mode, the ground voltage may be provided to a gate terminal of each of a plurality of LDMOS transistors ML1, ML2, and ML3 in the bandgap reference voltage generation circuit.

When the ground voltage is provided to the gate terminal of each of the plurality of the LDMOS transistors ML1, ML2, and ML3, the plurality of the LDMOS transistors ML1, ML2, and ML3 may operate in a first (e.g., linear) region. In this case, each of the plurality of the LDMOS transistors ML1, ML2, and ML3 may perform the function of smoothly passing a current generated by a corresponding one of a plurality of PMOS transistors MP1, MP2 and MP3.

When a voltage (e.g., 1.1 V) in a low voltage range is provided as a supply voltage $V_{DD}$, and when a common mode voltage $V_{CM}$, instead of the ground voltage, is provided to the gate terminal of each of the plurality of the LDMOS transistors ML1, ML2, and ML3, the plurality of the PMOS transistors MP1, MP2 and MP3 may not operate properly. To solve this problem, the plurality of the LDMOS transistors ML1, ML2, and ML3 may be respectively connected to the plurality of the PMOS transistors MP1, MP2, and MP3 in a cascode manner, and the ground voltage may be provided to the gate terminal of each of the plurality of the LDMOS transistors ML1, ML2, and ML3 in the low voltage mode.

When the ground voltage is provided to the gate terminal of the first LDMOS transistor ML1, the first LDMOS transistor ML1 may operate in the linear region. In this case, a voltage $V_{N1}$ corresponding to a first voltage Va may be generated at a first node N1. The voltage $V_{N1}$ generated at the first node N1 may be a value obtained, for example, by adding a source-drain voltage $V_{SD}$ of the first LDMOS transistor ML1 to the first voltage Va. However, when the ground voltage is provided to the gate terminal of the first LDMOS transistor ML1, the first voltage Va may be substantially equal to the voltage $V_{N1}$ at the first node N1 because the value of the source-drain voltage $V_{SD}$ is very small (e.g., 1 mV). Therefore, the first PMOS transistor MP1 may operate properly even when a voltage in the low voltage range is provided to the first PMOS transistor MP1 as the supply voltage $V_{DD}$.

When the ground voltage is provided to the gate terminal of the second LDMOS transistor ML2, the second LDMOS transistor ML2 may operate in the linear region. In this case, a voltage $V_{N2}$ corresponding to a second voltage Vb may be generated at a second node N2. The voltage $V_{N2}$ generated at the second node N2 may be a value obtained by adding a source-drain voltage $V_{SD}$ of the second LDMOS transistor ML2 to the second voltage Vb. However, when the ground voltage is provided to the gate terminal of the second LDMOS transistor ML2, the second voltage Vb may be substantially equal to the voltage $V_{N2}$ at the second node N2 because the value of the source-drain voltage $V_{SD}$ is very small (e.g., 1 mV). Therefore, the second PMOS transistor MP2 may operate properly even when a voltage in the low voltage range is provided to the second PMOS transistor MP2 as the supply voltage $V_{DD}$.

When the ground voltage is provided to the gate terminal of the third LDMOS transistor ML3, the third LDMOS transistor ML3 may operate in the linear region. In this case, a voltage $V_{N3}$ corresponding to a bandgap reference voltage VBGR may be generated at a third node N1. The voltage $V_{N3}$ generated at the third node N3 may be a value obtained, for example, by adding a source-drain voltage $V_{SD}$ of the third LDMOS transistor ML3 to the bandgap reference voltage VBGR. However, when the ground voltage is provided to the gate terminal of the first LDMOS transistor ML3, the bandgap reference voltage VBGR may be substantially equal to the voltage $V_{N3}$ at the third node N3 because the value of the source-drain voltage $V_{SD}$ is very small (for example, 1 mV). Therefore, the third PMOS transistor MP3 may operate properly even when a voltage in the low voltage range is provided to the third PMOS transistor MP3 as the supply voltage $V_{DD}$.

Consequently, when the plurality of the LDMOS transistors ML1, ML2, and ML3 operate in the linear region, each of the plurality of the LDMOS transistors ML1, ML2, and ML3 may function as a switch. As a result, voltages applied to drain terminals of the plurality of the LDMOS transistors ML1, ML2 and ML3 may correspond to voltages applied to source terminals of the plurality of the LDMOS transistors ML1, ML2 and ML3, respectively.

For example, when the ground voltage is provided to the gate terminal of each of the plurality of the LDMOS transistors ML1, ML2, and ML3, the bandgap reference voltage generation circuit may operate in a similar manner to a bandgap reference voltage generation circuit 31 that does not include the plurality of the LDMOS transistors ML1, ML2, and ML3, for example, as illustrated in FIG. 6.

Referring again to FIG. 4, when the switch controller recognizes that the mode of the bandgap reference voltage generation system is the high voltage mode (Y in operation S110), the switch controller may control the switch to connect a common mode voltage generator to the bandgap reference voltage generation circuit (operation S130).

Referring to FIG. 7, when the common mode voltage $V_{CM}$ is provided to the gate terminal of each of the plurality of the LDMOS transistors ML1, ML2, and ML3, the plurality of the LDMOS transistors ML1, ML2, and ML3 may operate in a second (e.g., saturation) region. In this case, each of the plurality of the LDMOS transistors ML1, ML2, and ML3 may perform the function of smoothly passing a current generated by a corresponding one of the plurality of the PMOS transistors MP1, MP2, and MP3.

When a voltage (e.g., 5 V) in a high voltage range is provided as the supply voltage $V_{DD}$, and when the plurality of the PMOS transistors MP1, MP2, and MP3 are not respectively connected to the plurality of the LDMOS transistors ML1, ML2, and ML3 in a cascode manner, a breakdown voltage may be provided to the plurality of the PMOS transistors MP1, MP2, and MP3. In addition, when transistors (e.g., PMOS transistors) other than the plurality of the LDMOS transistors ML1, ML2, and ML3 are used, the breakdown voltage may be provided to all transistors. To solve this problem, the plurality of the LDMOS transistors ML1, ML2, and ML3 should respectively be connected to the plurality of the PMOS transistors MP1, MP2 and MP3 in a cascode manner, and the ground voltage should be provided to the gate terminal of each of the plurality of the LDMOS transistors ML1, ML2, and ML3 in the high voltage mode.

By connecting the plurality of the LDMOS transistors ML1, ML2, and ML3 respectively to the plurality of the PMOS transistors MP1, MP2, and MP3 in a cascode manner and by providing the common mode voltage $V_{CM}$ to the gate terminal of each of the plurality of the PMOS transistors MP1, MP2, and MP3, it is possible to prevent the breakdown voltage from being provided to each of the plurality of the PMOS transistors MP1, MP2, and MP3. For example, each of the plurality of the LDMOS transistors ML1, ML2, and ML3 may prevent each of the plurality of the PMOS transistors MP1, MP2, and MP3 from being permanently damaged.

When the common mode voltage $V_{CM}$ is provided to the gate terminal of the first LDMOS transistor ML1, the first LDMOS transistor ML1 may operate in the saturation region. In this case, the first LDMOS transistor ML1 may generate a third voltage $V_{N1}$ at the first node N1. The third voltage $V_{N1}$ may be different from the first voltage Va and the second voltage Vb. The third voltage $V_{N1}$ generated at the first node N1 may be greater than a value obtained by subtracting a breakdown voltage of the first PMOS transistor MP1 from the supply voltage $V_{DD}$.

The third voltage $V_{N1}$ may be a value obtained by adding a gate-source voltage $V_{GS}$ of the first LDMOS transistor ML1 to the common mode voltage $V_{CM}$. The gate-source voltage $V_{GS}$ of the first LDMOS transistor ML1 may be set to an appropriate value so that the breakdown voltage is not provided to the first PMOS transistor MP1.

When the common mode voltage $V_{CM}$ is provided to the gate terminal of the second LDMOS transistor ML2, the second LDMOS transistor ML2 may operate in the saturation region. In this case, the second LDMOS transistor ML2 may generate a fourth voltage $V_{N2}$ at the second node N2. The fourth voltage $V_{N2}$ may be different from the first voltage Va and the second voltage Vb. The fourth voltage $V_{N2}$ generated at the second node N2 may be greater than a value obtained, for example, by subtracting a breakdown voltage of the second PMOS transistor MP2 from the supply voltage $V_{DD}$.

The fourth voltage $V_{N2}$ may be a value obtained, for example, by adding a gate-source voltage $V_{GS}$ of the second LDMOS transistor ML2 to the common mode voltage $V_{CM}$. The gate-source voltage $V_{GS}$ of the second LDMOS transistor ML2 may be set to an appropriate value so that the breakdown voltage is not provided to the second PMOS transistor MP2.

When the common mode voltage $V_{CM}$ is provided to the gate terminal of the third LDMOS transistor ML3, the third LDMOS transistor ML3 may operate in the saturation region. In this case, the third LDMOS transistor ML3 may generate a fifth voltage $V_{N3}$ at the third node N1. The fifth voltage $V_{N3}$ may be different from the first voltage Va and the second voltage Vb.

The fifth voltage $V_{N3}$ generated at the third node N3 may be greater than a value obtained, for example, by subtracting a breakdown voltage of the third PMOS transistor MP3 from the supply voltage $V_{DD}$.

The fifth voltage $V_{N3}$ may be a value obtained, for example, by adding a gate-source voltage $V_{GS}$ of the third LDMOS transistor ML3 to the common mode voltage $V_{CM}$. The gate-source voltage $V_{GS}$ of the third LDMOS transistor ML3 may be set to an appropriate value so that the breakdown voltage is not provided to the third PMOS transistor MP3.

As a result, a plurality of LDMOS transistors may respectively generate different voltages at drain terminals of a plurality of PMOS transistors in the high voltage mode and the low voltage mode.

Referring again to FIG. 5, when the ground voltage is provided to the gate terminal of each of the plurality of the LDMOS transistors ML1, ML2, and ML3 in the low voltage mode, a voltage corresponding to the first voltage Va may be generated at the first node N1, a voltage corresponding to the second voltage Vb may be generated at the second node N2, and a voltage corresponding to the bandgap reference voltage VBGR may be generated at the third node N3.

Referring again to FIG. 7, when the common mode voltage $V_{CM}$ is provided to the gate terminal of each of the plurality of the LDMOS transistors ML1, ML2, and ML3 in the high voltage mode, a voltage large enough to prevent a breakdown voltage from being provided to the first PMOS transistor MP1 may be generated at the first node N1, a voltage large enough to prevent the breakdown voltage from being provided to the second PMOS transistor MP2 may be generated at the second node N2, and a voltage large enough to prevent the breakdown voltage from being provided to the third PMOS transistor MP3 may be generated at the third node N3.

Therefore, the bandgap reference voltage generation system may be used in a wider supply voltage range than other types of bandgap reference voltage circuit.

An example of a bandgap reference voltage VBGR generated by the bandgap reference voltage generation circuit 30 will be described below. Since the principles for generating the bandgap reference voltage VBGR in the low voltage mode and the high voltage mode may be the same, a case where the bandgap reference voltage is generated in the high voltage mode will be mainly described.

The plurality of the PMOS transistors MP1, MP2, and MP3 may generate first through third currents I1 through I3, respectively. Each of the first through third currents I1 through I3 may be generated based on Equation 2.

$$I=(\mu_n \cdot C_{ox})(W/L)(V_{GS}-V_t)^2 \qquad (2)$$

where $\mu_n$ is a coefficient representing the electron mobility of a PMOS transistor, $C_{ox}$ is a capacitance of the PMOS transistor, W is a channel width of the PMOS transistor, L is a channel length of the PMOS transistor, $V_{GS}$ is a gate-source voltage of the PMOS transistor, and $V_t$ is a thermal voltage proportional to an absolute temperature and defined as kT/q, where k is the Boltzmann constant, q is the quantity of electric charge, and T is the temperature.

In one embodiment, the first current I1 may be determined based on a coefficient representing electron mobility of the second PMOS transistor MP2, a capacitance of the second PMOS transistor MP2, a channel width of the second PMOS transistor MP2, a channel length of the second PMOS transistor MP2, and a gate-source voltage of the second PMOS transistor MP2.

The second current I2 may be determined based on a coefficient representing electron mobility of the first PMOS transistor MP1, a capacitance of the first PMOS transistor MP1, a channel width of the first PMOS transistor MP1, a channel length of the first PMOS transistor MP1, and a gate-source voltage of the first PMOS transistor MP1.

The third current I3 may be determined by a coefficient representing electron mobility of the third PMOS transistor MP3, a capacitance of the third PMOS transistor MP3, a channel width of the third PMOS transistor MP3, a channel length of the third PMOS transistor MP3, and a gate-source voltage of the third PMOS transistor MP3.

The factors that determine the first current I1, the second current I2, and the third current I3 may be determined so that the first current I1, the second current I2, and the third current I3 correspond to each other.

A second BJT Q2 includes N BJTs connected in parallel, for example, as described above with reference to FIG. 3. Therefore, the value of a current I2a may be determined based on Equation 3.

$$I2a=V_t*1n(N)/R2 \qquad (3)$$

The relationship between the second voltage Vb applied to a first BJT Q1, a voltage Va1 applied to the second BJT Q2, and a voltage Va2 applied to a second resistor R2 may be determined based on Equation 4.

$$Va=Va1+Va2=Vb \qquad (4)$$

The voltage Va2 applied to the second resistor R2 may be calculated using Equations 3 and 4 to satisfy Equation 5.

$$Va2=Vb-Va=R2*I2a=V_t*1n(N) \qquad (5)$$

When the values of a first resistor R1 and a third resistor R3 are equal to each other and the value of Vb/R3 is equal to the value of Va/R1, the second current I2 may be defined by Equation 6.

$$I2=I2a+I2b=Vb/R3+Va2/R2=Vb/R3+1n(N)*V_t/R2 \qquad (6)$$

Using Equations 2 through 6, the bandgap reference voltage VBGR may be calculated as in Equation 7.

$$\begin{aligned} VBGR &= R4*I3 \\ &= R4*I2 \\ &= (R4/R3)*Vb+(R4/R2)*\ln(N)VT \\ &= (R4/R3)*(Vb+(R3/R2)*\ln(N)VT) \end{aligned} \qquad (7)$$

As a result, the bandgap reference voltage VBGR generated by the bandgap reference voltage generation circuit may have an appropriate value due to the factors in Equation 7.

Figure 8:
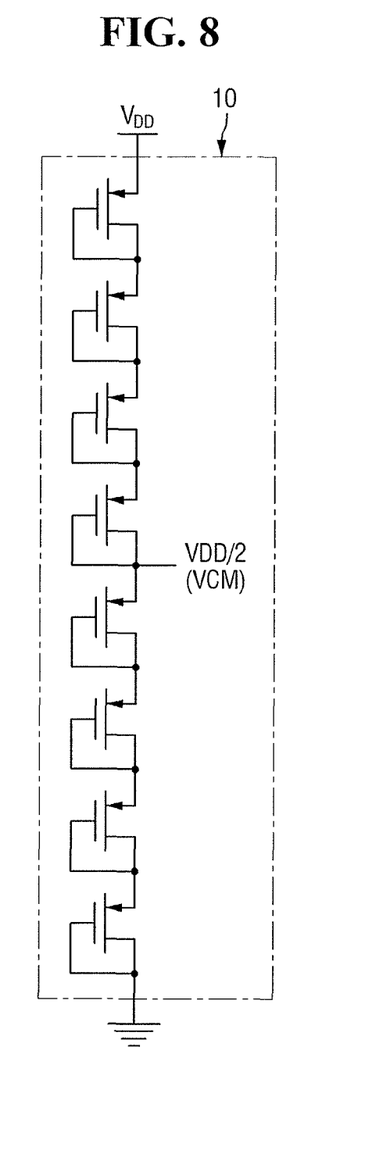
FIG. 8 illustrates an embodiment of a common mode voltage generator.

FIG. 8 illustrates an embodiment of a common mode voltage generator 10 according to some embodiments. Referring to FIG. 8, the common mode voltage generator 10 may include a plurality of PMOSs for self-body bias. For example, the PMOS transistors in the common mode voltage generator 10 may be between a supply voltage $V_{DD}$ and a reference (e.g., ground) voltage and may be connected in series to each other.

Each of the PMOS transistors in the common mode voltage generator 10 may have a body and a source connected to each other. When the body and the source of each of the PMOS transistors are connected to each other, resistance values generated by the PMOS transistors may be equal.

A common mode voltage $V_{CM}$ may be output from an output terminal of the common mode voltage generator 10. The common mode voltage $V_{CM}$ may have a value of VDD/2, for example, as described in Equation 1.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, generators, generation circuits, and other signal generating, signal providing, and signal processing features of the disclosed embodiments, may be implemented in logic which, for example, may include hardware, software, or both. When implemented at least partially in hardware, the controllers, generators, generation circuits, and other signal generating, signal providing, and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, generators, generation circuits, and other signal generating, signal providing, and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, when the common mode voltage generator uses a plurality of PMOS transistors, each having a body and a source connected to each other, without using resistors, the area of the common mode voltage generator 10 may be reduced or minimized.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A bandgap reference voltage generation system, comprising:
    a common mode voltage generator to generate a common mode voltage;
    a bandgap reference voltage generation circuit to generate a bandgap reference voltage, the bandgap reference voltage generation circuit including a first type of transistors and a second type of transistors having source terminals respectively connected to drain terminals of the first type of transistors; and
    a switch controller to provide a ground voltage to the bandgap reference voltage generation circuit in a first mode and the common mode voltage to the bandgap reference voltage generation circuit in a second mode, wherein the bandgap reference voltage generation circuit is to cause the second type of transistors to operate in:
    a linear region by providing the common mode voltage to a gate electrode of each of the second type of transistors in the first mode and
    a saturation region by providing the ground voltage to the gate electrode of each of the second type of transistors in the second mode.

2. The bandgap reference voltage generation system as claimed in claim 1, wherein:
    the first type of transistors include p-channel metal oxide semiconductor (PMOS) transistors, and
    the second type of transistors include laterally diffused metal oxide semiconductor (LDMOS) transistors.

3. The bandgap reference voltage generation system as claimed in claim 1, wherein each of the second type of transistors are respectively connected to each of the first type of transistors in a cascode manner.

4. The bandgap reference voltage generation system as claimed in claim 1, wherein each of the second type of transistors is to pass a current generated by the first type of transistors in the first mode or the second mode.

5. The bandgap reference voltage generation system as claimed in claim 1, wherein the second type of transistors are to prevent a breakdown voltage from being to the first type of transistors in the second mode.

6. A bandgap reference voltage generation circuit, comprising:
    an amplifier to output an operational amplified signal based on a first voltage and a second voltage;
    a first PMOS transistor, a second PMOS transistor, and a third PMOS transistor having gate terminals connected to an output terminal of the amplifier and having respective source terminals connected to a supply voltage terminal;
    a first LDMOS transistor having a source terminal connected to a drain terminal of the first PMOS transistor, a gate terminal connected to a first node, and a drain terminal connected to an output terminal of the first voltage;
    a second LDMOS transistor having a source terminal connected to a drain terminal of the second PMOS transistor, a gate terminal connected to the first node, and a drain terminal connected to an output terminal of the second voltage; and
    a third LDMOS transistor having a source terminal connected to a drain terminal of the third PMOS transistor, a gate terminal connected to the first node, and a drain terminal connected to an output terminal of a bandgap reference voltage.

7. The bandgap reference voltage generation circuit as claimed in claim 6, further comprising:
    a first resistor between the output terminal of the first voltage and a second node;
    a plurality of first bipolar junction transistors (BJTs), each of the plurality of BJTs having an emitter terminal connected to the second node and a base terminal and a collector terminal connected to a ground voltage terminal;

a second resistor between the output terminal of the first voltage and the ground voltage terminal;

a third resistor between the output terminal of the second voltage and a third node;

a second KU having an emitter terminal connected to the third node and a base terminal and a collector terminal connected to the ground voltage terminal;

a fourth resistor between the output terminal of the second voltage and the ground voltage terminal; and a fifth resistor between the output terminal of the bandgap reference voltage and the ground voltage terminal.

8. The bandgap reference voltage generation circuit as claimed in claim 6, wherein the first LDMOS transistor is to provide a third voltage to the drain terminal of the first PMOS transistor when a common mode voltage is supplied to the first node, and wherein the third voltage is greater than a value obtained by subtracting a breakdown voltage of the first PMOS transistor from a supply voltage.

9. The bandgap reference voltage generation circuit as claimed in claim 6, wherein the second LDMOS transistor is to provide a fourth voltage to the drain terminal of the second PMOS transistor when a common mode voltage is supplied to the first node, and wherein the fourth voltage is greater than a value obtained by subtracting a breakdown voltage of the second PMOS transistor from a supply voltage.

10. The bandgap reference voltage generation circuit as claimed in claim 6, wherein the third LDMOS transistor is to provide a fifth voltage to the drain terminal of the third PMOS transistor when a common mode voltage is supplied to the first node, and wherein the fifth voltage is greater than a value obtained by subtracting a breakdown voltage of the third PMOS transistor from a supply voltage.

11. The bandgap reference voltage generation circuit as claimed in claim 6, wherein the first LDMOS transistor is to provide a voltage corresponding to the first voltage to the drain terminal of the first PMOS transistor when a ground voltage is supplied to the first node.

12. The bandgap reference voltage generation circuit as claimed in claim 6, wherein the second LDMOS transistor is to provide a voltage corresponding to the second voltage to the drain terminal of the second PMOS transistor when a ground voltage is supplied to the first node.

13. The bandgap reference voltage generation circuit as claimed in claim 6, wherein the third LDMOS transistor is to provide a voltage corresponding to the bandgap reference voltage to the drain terminal of the third PMOS transistor when a ground voltage is supplied to the first node.

14. A bandgap reference voltage generation circuit, comprising:

an amplifier to output an operational amplified signal based on a first voltage and a second voltage;

a first PMOS transistor to generate a first current based on the operational amplified signal received through a first gate terminal and a supply voltage received through a first source terminal;

a second PMOS transistor to generate a second current based on the operational amplified signal received through a second gate terminal and the supply voltage received through a second source terminal;

a third PMOS transistor to generate a third current the operational amplified signal received through a third gate terminal and receiving the supply voltage through a third source terminal;

a first transistor connected to the first PMOS transistor in a cascode manner;

a second transistor connected to the second PMOS transistor in the cascode manner; and a third transistor connected to the third PMOS transistor in the cascode manner, wherein the first transistor is to provide different voltages to a first drain terminal of the first PMOS transistor in a first mode and a second mode different from the first mode, wherein the second transistor is to provide different voltages to a second drain terminal of the second PMOS transistor in the first mode and the second mode, and wherein the third transistor is to provide different voltages to a third drain terminal of the third PMOS transistor in the first mode and the second mode.

15. The bandgap reference voltage generation circuit as claimed in claim 14, wherein the first transistor, the second transistor, and the third transistor are LDMOS transistors.

16. The bandgap reference voltage generation circuit as claimed in claim 14, wherein:

a ground voltage is applied to a gate terminal of each of the first transistor, the second transistor, and the third transistor in the first mode, the first transistor is to provide a voltage corresponding to the first voltage to the first drain terminal in the first mode, the second transistor is to provide a voltage corresponding to the second voltage to the second drain terminal in the first mode, and the third transistor is to provide a voltage corresponding to a bandgap reference voltage to the third drain terminal in the first mode.

17. The bandgap reference voltage generation circuit as claimed in claim 14, wherein:

a common mode voltage is applied to the gate terminal of each of the first transistor, the second transistor, and the third transistor in the second mode, the first transistor is to provide a third voltage different from the first voltage and the second voltage to the first drain terminal in the second mode, the second transistor is to provide a fourth voltage different from the first voltage and the second voltage to the second drain terminal in the second mode, and the third transistor is to provide a fifth voltage different from the bandgap reference voltage to the third drain terminal in the second mode.

18. The bandgap reference voltage generation circuit as claimed in claim 17, wherein the third voltage is greater than a value obtained by subtracting a breakdown voltage of the first PMOS transistor from the supply voltage.

19. The bandgap reference voltage generation circuit as claimed in claim 17, wherein the fourth voltage is greater than a value obtained by subtracting a breakdown voltage of the second PMOS transistor from the supply voltage.

20. The bandgap reference voltage generation circuit as claimed in claim 17, wherein the fifth voltage is greater than a value obtained by subtracting a breakdown voltage of the third PMOS transistor from the supply voltage.

* * * * *

UNITED STATES PATENT AND TRADEMARK OFFICE
CERTIFICATE OF CORRECTION

PATENT NO. : 10,359,799 B2
APPLICATION NO. : 15/914095
DATED : July 23, 2019
INVENTOR(S) : Woo Jin Jang, Seung Hyun Oh and Jong Woo Lee

Page 1 of 1

It is certified that error appears in the above-identified patent and that said Letters Patent is hereby corrected as shown below:

In the Claims

Column 12, Line 59 - Column 13, Line 11 Claim 7 should read:
7. The bandgap reference voltage generation circuit as claimed in claim 6, further comprising:
    a first resistor between the output terminal of the first voltage and a second node;
    a plurality of first bipolar junction transistors (BJTs), each of the plurality of BJTs having an emitter terminal connected to the second node and a base terminal and a collector terminal connected to a ground voltage terminal;
    a second resistor between the output terminal of the first voltage and the ground voltage terminal;
    a third resistor between the output terminal of the second voltage and a third node;
    a second BJT having an emitter terminal connected to the third node and a base terminal and a collector terminal connected to the ground voltage terminal;
    a fourth resistor between the output terminal of the second voltage and the ground voltage terminal; and
    a fifth resistor between the output terminal of the bandgap reference voltage and the ground voltage terminal.

Signed and Sealed this
Thirteenth Day of October, 2020

Andrei Iancu
*Director of the United States Patent and Trademark Office*